(12) United States Patent
Tanaka et al.

(10) Patent No.: US 8,559,581 B2
(45) Date of Patent: Oct. 15, 2013

(54) CDR CIRCUIT, RECEPTION APPARATUS, AND COMMUNICATION SYSTEM

(75) Inventors: Tomokazu Tanaka, Kanagawa (JP); Hidekazu Kikuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 209 days.

(21) Appl. No.: 13/067,520

(22) Filed: Jun. 7, 2011

(65) Prior Publication Data

US 2012/0033774 A1 Feb. 9, 2012

(30) Foreign Application Priority Data

Aug. 6, 2010 (JP) ................................. 2010-177337

(51) Int. Cl.
*H03D 3/24* (2006.01)
(52) U.S. Cl.
USPC ........... 375/375; 375/376; 375/355; 375/359; 375/360; 375/361; 327/149; 327/152; 327/153; 327/158; 327/161

(58) Field of Classification Search
USPC ......... 375/373, 371, 375, 376, 355, 359, 360, 375/361; 327/149, 152, 153, 158, 161; 713/400, 401, 500, 503, 600
See application file for complete search history.

(56) References Cited

U.S. PATENT DOCUMENTS

| 4,100,541 A | 7/1978 | Quesnell, Jr. |
| 5,790,610 A * | 8/1998 | Julyan ........................... 375/361 |
| 6,236,695 B1 * | 5/2001 | Taylor ............................ 375/372 |

FOREIGN PATENT DOCUMENTS

| JP | 2863763 | 12/1998 |
| JP | 2009-232462 | 10/2009 |

* cited by examiner

*Primary Examiner* — Phuong Phu
(74) *Attorney, Agent, or Firm* — Rader, Fishman & Grauer PLLC

(57) ABSTRACT

Disclosed herein is a CDR circuit including delay elements, including: a divider having a delay element and configured to extract a clock by using, as a trigger, a data input with a signal transition regularly inserted; and a latch configured to latch an input data signal in synchronization with the clock extracted by the divider.

17 Claims, 11 Drawing Sheets

FIG.1
BACKGROUND
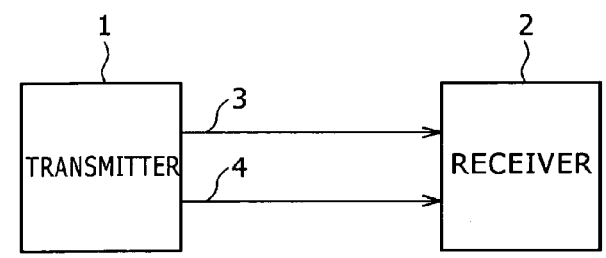
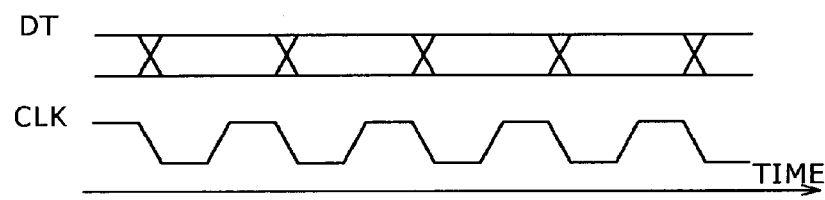
FIG.2
BACKGROUND
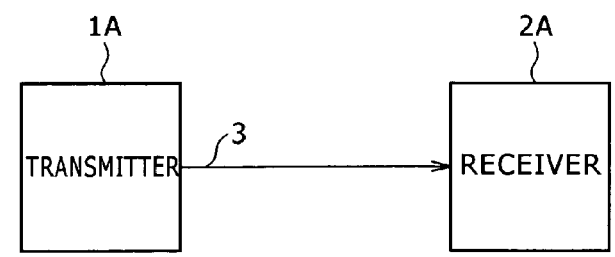
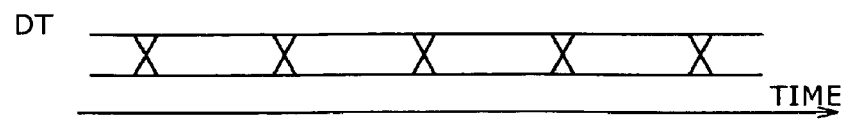

BACKGROUND

BACKGROUND

BACKGROUND

BACKGROUND

BACKGROUND

BACKGROUND

BACKGROUND

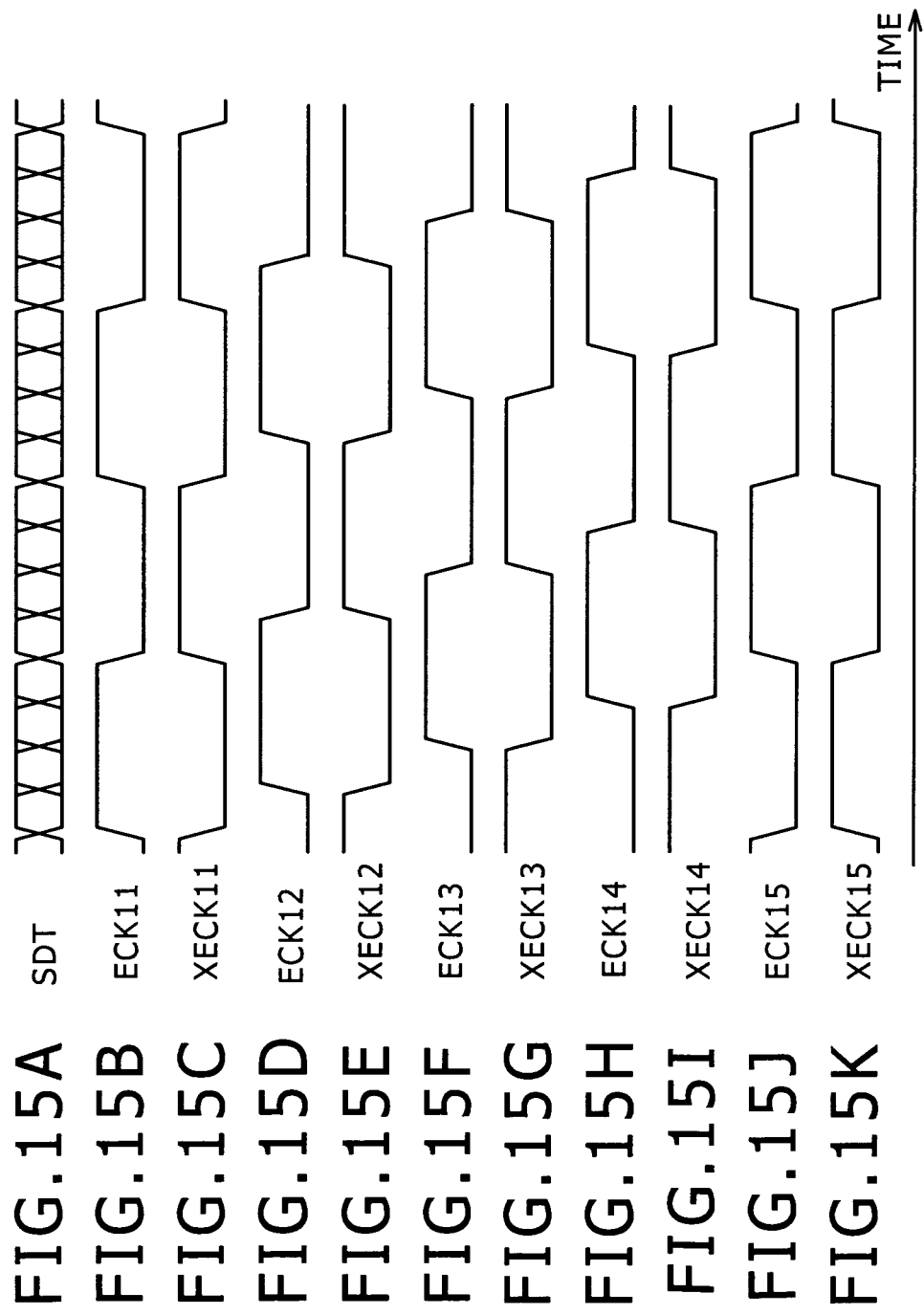

CDR CIRCUIT, RECEPTION APPARATUS, AND COMMUNICATION SYSTEM

BACKGROUND

The present technology relates to a CDR (Clock Data Recovery) circuit, a reception apparatus, and a communication system that are applicable to serial communication for receiving digital signals for example.

Generally, in serial data communication, data DT and clock CLK are transmitted in parallel from a transmitter 1 to a receiver 2 through a data line 3 and a clock line 4 as shown in FIG. 1.

Data DT and clock CLK are entered in the receiver 2 with a certain timing. The receiver 2 latches the input data with a transition timing of the input clock.

In this case, while the circuit configuration of the receiver 2 is simplified, high-speed data communication applications are difficult because a difference in wiring delay between data DT and clock CLK, if any, causes a timing shift for latching the input data.

In order to overcome this problem, a scheme called clock embedding is generally used in high-speed serial data communication.

Referring to FIG. 2, there is shown schematic diagram illustrating the clock-embedded transmission scheme.

In the clock-embedded transmission scheme, only data signal is transmitted from a transmitter 1A to a receiver 2A. Because no clock signal is transmitted, the above-mentioned problem of the difference in delay between the data and clock wirings does not occur.

In the receiver 2A, a CDR (Clock Data Recovery) circuit is arranged. This CDR circuit recovers a clock signal from a data train signal by use of the periodicity of data signal transitions. The receiver 2A latches the input signal by use of this recovered clock.

In order to adjust the frequency of a clock signal with reference to the transition point of data in executing clock recovery, the CDR circuit requires a data transition rate higher than a certain frequency. If the data transition rate is too low, no information for clock extraction is obtained, thereby disabling stable clock extraction.

Therefore, the serial signal transmission based on the clock embedded scheme using the CDR circuit must use a certain method to ensure that the bit transition rate in data will not become too small.

Referring to FIG. 3, there is shown a clock-embedded transmission scheme based on reference transition, one of the schemes for maintaining the bit transition rate.

This scheme is used in a technology disclosed in Japanese Patent No. 2863763.

In this scheme, a rising transition is inserted in every certain number of bits of signal data so as to always enter a clock transition into the receiver within certain intervals.

A scheme in which a falling edge is inserted instead of a rising edge into every certain periods also provides the substantially the same effect as that described above.

Further, there is also a scheme in which a rising edge or a falling edge is inserted in accordance with the value of a bit before a reference transition. Manchester encoding (refer to U.S. Pat. No. 4,100,541) is one type of this scheme.

Referring to FIG. 4, there is shown an example of a transmission signal based on Manchester encoding.

In the example shown in FIG. 4, it is seen that a bit transition always occurs once in every two bits. In a receiver based on Manchester encoding, this transition is used to simplify the configuration of the CDR circuit of the receiver.

SUMMARY

The following describes a specific exemplary configuration of a CDR circuit.

Referring to FIG. 5, there is shown an exemplary configuration of a CDR circuit for executing clock recovery of a data signal by use of the reference transition shown in FIG. 3.

Referring to FIG. 6, there is shown a timing chart indicative of an operational outline of the CDR circuit shown in FIG. 5.

In this example, the reference transition period is four bits for example.

The CDR circuit 10 shown in FIG. 5 has a phase comparator 11, a selector 12, a voltage control oscillator (VCO) 13, a divider 14, and a D-type flip-flop (DFF) 15.

In the CDR circuit 10, if an input data rate is expressed by f bps, the VCO 13 oscillates at frequency f Hz to generate extracted clock ECK.

The phase comparator 11 compares the phase of the extracted clock ECK and the input data ID to output a comparison result. Only when the selector 12 is turned on, the phase comparator 11 updates a frequency control signal of the VCO 13 with the result.

The selector 12 is controlled by a divided clock DECK obtained by dividing the extracted clock ECK for ¼ frequency by the divider 14 and is configured to take out only a result of the comparison between the reference transition of the input data and the extracted clock ECK.

As a whole, this CDR circuit 10 operates as a PLL (Phase Locked Loop) circuit that locks on the reference transition of the input data ID.

The PLL circuit operates by varying the operation frequency of the VCO 13 by use of the output of the phase comparator 11, so that, if the frequency of the input data varies, a certain delay always occurs until the oscillation frequency of the VCO 13 follows fluctuations.

Consequently, if a high-speed jitter (a fluctuation of data frequency) is added to an input data signal, the CDR circuit 10 shown in FIG. 5 presents a problem of tending to cause a signal error because the variation in the extracted clock cannot follow the jitter.

Referring to FIG. 7, there is shown an exemplary configuration of a CDR circuit for executing clock recovery of a data signal by use of the reference transition disclosed in Japanese Patent Laid-open No. 2009-232462 (hereinafter referred to as Patent Document 1).

Referring to FIG. 8, there is shown a timing chart indicative of an outline of an operation of the CDR circuit shown in FIG. 7.

The CDR circuit 20 shown in FIG. 7 has a transition detector 21, a reference transition extraction circuit 22, a clock generator 23, a mask signal generator 24, a phase comparator 25, delay elements 26-1 through 26-4, and DFFs 27-1 through 27-4.

Here, an input data rate is expressed by f bps.

The transition detector 21 generates transition pulse SPLS having maximum frequency f Hz corresponding to data transition from input data ID.

The reference transition extraction circuit 22 takes only the transition pulse corresponding to the reference transition from the transition pulse SPLS.

The clock generation circuit 23 generates extracted clock ECK1 having f/4 Hz corresponding to the reference transition pulse RSPLS and delays the generated extracted clock ECK1 by use of the delay elements 26-1 through 26-4 of 1/f second, thereby generating extracted clocks ECK2 through ECK5.

A timing signal for extracting the reference transition pulse RSPLS is generated by the mask signal generator 24 by use of any one of the extracted clocks ECK1 through ECK5.

Delay amounts of the delay elements 26-1 through 26-4 are feed-back controlled by comparing the phase of the extracted clock ECK1 with the phase of the extracted clock ECK5 through the phase comparator 25, thereby aligning these phases.

As a whole, the CDR circuit 20 operates as a DLL circuit for executing delay control by use of reference transition. Because a maximum delay amount until phase follow-up is executed if a jitter is applied to the input data signal is only 4/f second, the CDR circuit 20 has more jitter resistance than that of the PLL-type mentioned above.

However, in this circuit configuration, the delays of the mask signal generator 24, the reference transition extraction circuit 22, and the clock generation circuit 23 limit the upper limit of the operation speed, thereby presenting a problem that high-speed operations are difficult.

Therefore, the present technology addresses the above-identified and other problems associated with related-art methods and apparatuses and solves the addressed problems by providing a CDR circuit, a reception apparatus, and a communication system that are configured to provide a high-speed clock extraction operation and be robust against jitter input, thereby deterring the occurrence of signal errors.

In carrying out the technology and according to one embodiment thereof, there is provided a CDR (Clock Data Recovery) circuit. This CDR circuit includes a divider having a delay element and configured to extract a clock by using a data input with a signal transition regularly inserted as a trigger; and a latch configured to latch an input data signal in synchronization with the clock extracted by the divider.

In carrying out the technology and according to another embodiment thereof, there is provided a reception apparatus. This reception apparatus has a CDR circuit configured to receive a serial data signal propagated over a data line and regularly inserted with a signal transition to recover a clock and data in accordance with the received serial data signal. The CDR circuit includes a divider having a delay element for extracting a clock by using, as a trigger, a data input regularly inserted with a signal transition and a latch for latching an input data signal in synchronization with a clock extracted by the divider.

In carrying out the technology and according to still another embodiment thereof, there is provided a communication system. This communication system has a transmission apparatus configured to transmit a serial data signal regularly inserted with a signal transition to a data line and a reception apparatus configured to receive the serial data signal propagated over the data line, the serial data signal regularly inserted with a signal transition. In this communication system, the reception apparatus has a CDR circuit for recovering a clock and data in accordance with the received serial data signal. The CDR circuit has a divider having a delay element and configured to extract a clock by using a data input with a signal transition regularly inserted as a trigger and a latch configured to latch an input data signal in synchronization with the clock extracted by the divider.

As described above and according to embodiments of the present technology, a simple circuit configuration is provided that is high in signal extraction speed, robust against jitter input, and suppressive in signal error occurrence.

BRIEF DESCRIPTION OF THE DRAWINGS

Other features and advantages of the technology will become apparent from the following description of embodiments with reference to the accompanying drawings in which:

FIG. 1 is a schematic diagram illustrating a general serial data communication scheme;

FIG. 2 is a schematic diagram illustrating a clock-embedded transmission scheme;

FIGS. 15A through 15K are timing charts indicative of an outline of an operation of the CDR circuit shown in FIG. 14.

DETAILED DESCRIPTION OF THE PREFERRED EMBODIMENTS

This technology will be described in further detail by way of embodiments thereof with reference to the accompanying drawings.

It should be noted that the description will be made in the following order:

(1) First embodiment (the first exemplary configuration of CDR circuit);

(2) Second embodiment (the second exemplary configuration of CDR circuit); and (3) Third embodiment (the third exemplary configuration of CDR circuit).

Figure 9:
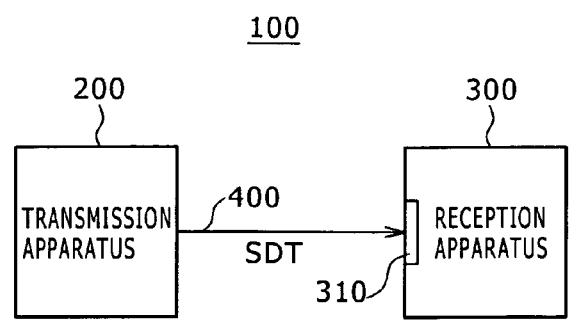
FIG. 9 is a schematic diagram illustrating a basic configuration of a communication system practiced as one embodiment of the present technology.

Now, referring to FIG. 9, there is shown a basic configuration of a communication system practiced as one embodiment of the present technology.

This communication system 100 has a transmission apparatus 200, a reception apparatus 300, and a data line 400 connected between the transmission apparatus 200 and the reception apparatus 300.

The transmission apparatus 200 transmits two or more phase-locked serial data signals SDT to the reception apparatus 300 via the data line 400.

The reception apparatus 300 functions as a receiver for serial communication for receiving serial data signals SDT propagated over the data line 400.

The reception apparatus 300 has a CDR (Clock Data Recovery) circuit 310.

The CDR circuit 310 extracts a clock through a divider incorporating delay elements, by use of a data input with a signal transition regularly inserted, as a trigger, thereby latching a data signal by use of the extracted clock.

The CDR circuit 310 executes feedback control on a delay amount of the delay elements in the divider by comparing a phase of the extracted clock and a phase of the extracted clock delayed by the delay elements.

The following specifically describes the configuration and functions of the CDR circuit arranged in the reception apparatus 300 having a characteristic configuration of the present embodiment.

In what follows, the reference data transmission interval is four bits for example.

(1) First Embodiment

Figure 10:
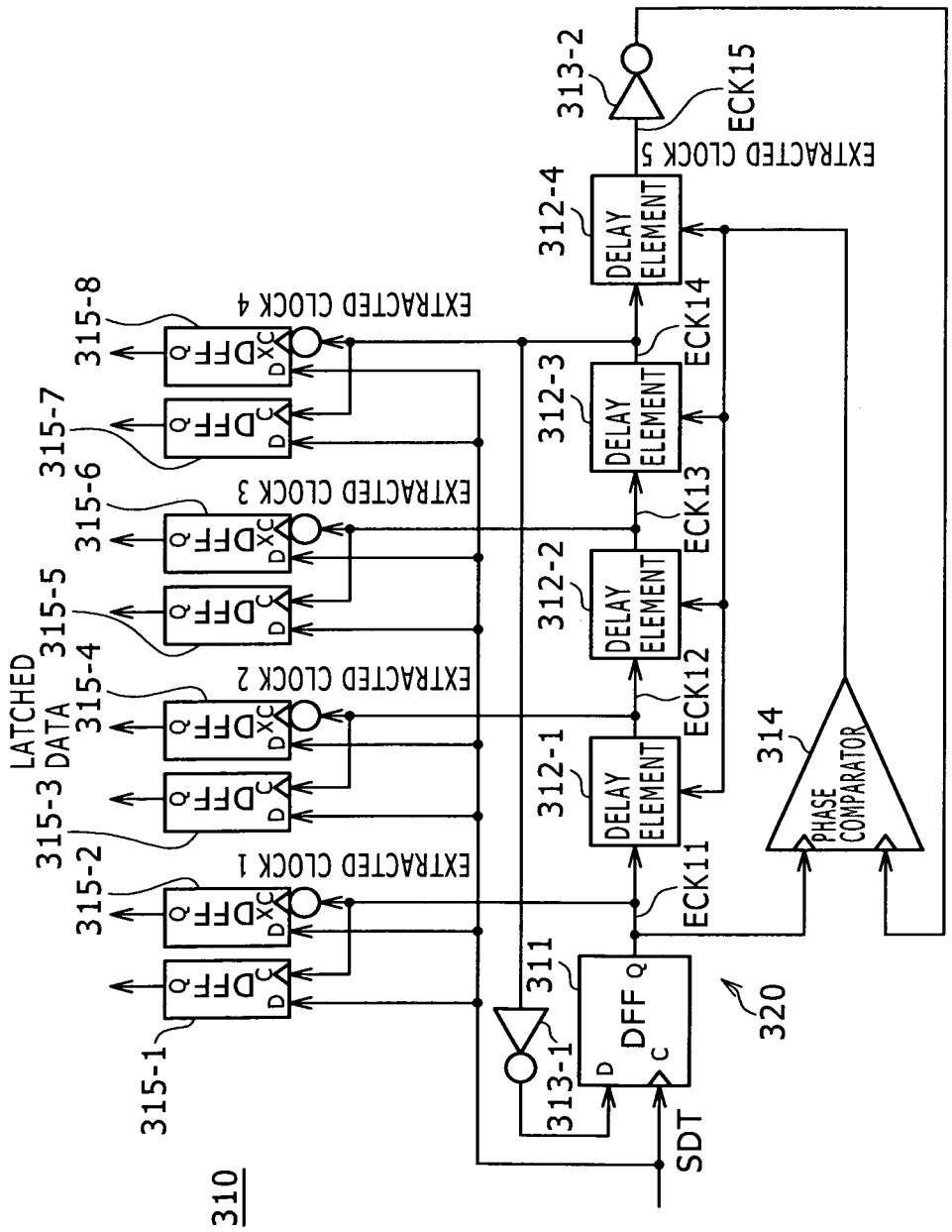
FIG. 10 is a block diagram illustrating an exemplary configuration of a CDR circuit in a reception apparatus practiced as a first embodiment of the present technology.

Referring to FIG. 10, there is shown an exemplary configuration of the CDR circuit arranged in the reception apparatus practiced as the first embodiment of the technology.

The CDR circuit 310 shown in FIG. 10 has a DFF (D-type flip-flop) 311 for division, delay elements 312-1 through 312-4, inverters 313-1 and 313-2, a phase comparator 314, and DFFs 315-1 through 315-8 for data latch.

The DFF 311 and the delay elements 312-1 through 312-4 form a divider 320.

A clock input terminal C of the DFF 311 is connected to a supply line of a serial data signal SDT that is a received input signal and a data input terminal D is connected to the output of the inverter 313-1. A data output terminal Q of the DFF 311 is connected to the input terminal of the delay element 312-1, one of the input terminals of the phase comparator 314, the clock input terminal C of the DFF 315-1, and an inverted clock input terminal XC of the DFF 315-2.

The DFF 311 outputs a first extracted clock ECK11 from the data output terminal Q.

The output terminal of the delay element 312-1 is connected to the input terminal of the delay element 312-2, the clock input terminal C of the DFF 315-3 and the inverted clock input terminal XC of the DFF 315-4.

The delay element 312-1 outputs a second extracted clock ECK12 obtained by delaying the first extracted clock ECK11 by the DFF 311.

The output terminal of the delay element 312-2 is connected to the input terminal of the delay element 312-3, the clock input terminal C of the DFF 315-5, and the inverted clock input terminal XC of the DFF 315-6.

The delay element 312-2 outputs a third extracted clock ECK13 obtained by delaying the second extracted clock ECK12 by the delay element 312-2.

The output terminal of the delay element 312-3 is connected to the input terminal of the delay element 312-4, the input terminal of the inverter 313-1, the clock input terminal C of the DFF 315-7, and the inverted clock input terminal XC of the DFF 315-8.

The delay element 312-3 outputs a fourth extracted clock ECK14 obtained by delaying the third extracted clock ECK13 by the delay element 312-2.

The output terminal of the delay element 312-4 is connected to the input terminal of the inverter 313-2.

The delay element 312-4 outputs a fifth extracted clock ECK15 obtained by delaying the fourth extracted clock ECK14 by the delay element 312-3.

The output of the inverter 313-2 is connected to the other input of the phase comparator 314.

The output of the phase comparator 314 is connected to a control terminal for adjusting a delay amount of the cascaded delay elements 312-1 through 312-4.

The phase comparator 314 feedback-controls the delay amount of the delay elements 312-1 through 312-4 so as to align the phases of the inverted signal of the fifth extracted clock ECK15 and the first extracted clock ECK11.

The data input terminal D of the data latch DFFs 315-1 through 315-8 is connected to the supply line of the serial data signal SDT that is an input signal.

The following describes an operation of the CDR circuit 310 having the configuration described above.

FIGS. 11A through 11F show timing charts indicative of an outline of an operation of the CDR circuit shown in FIG. 10.

Figure 11:
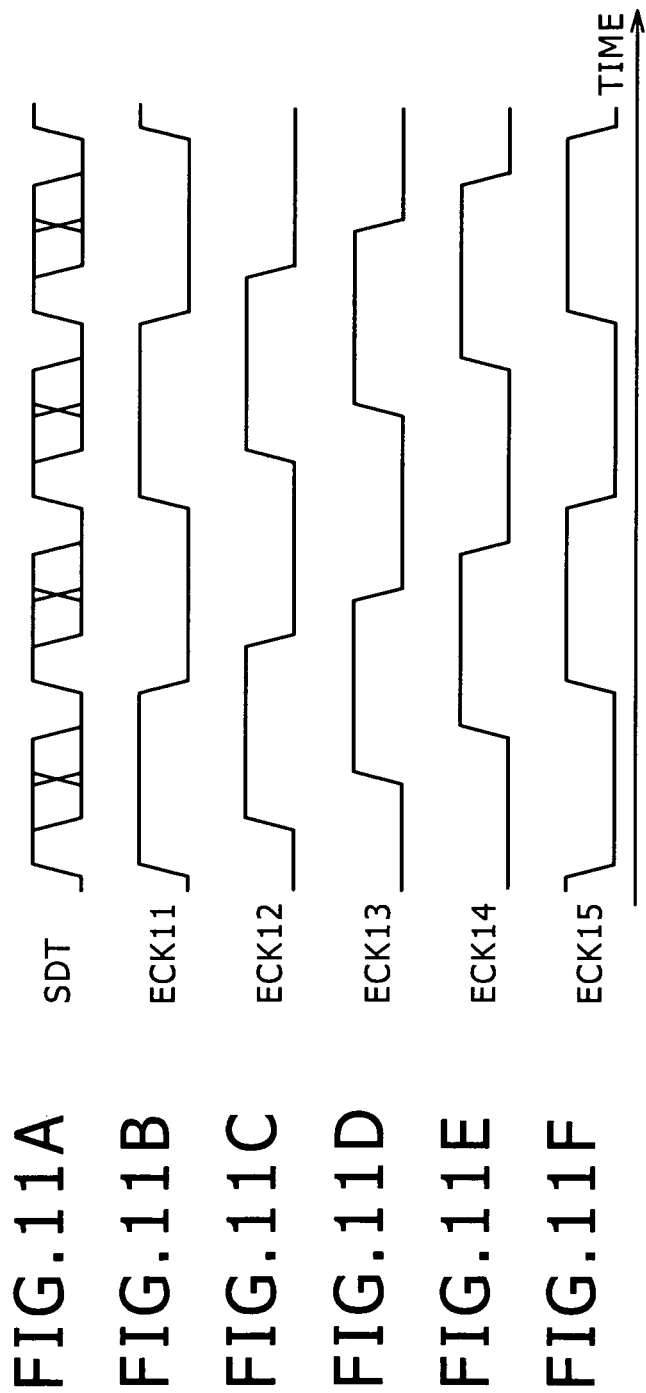
FIGS. 11A through 11F are timing charts indicative of an outline of an operation of the CDR circuit shown in FIG. 10.

FIG. 11A shows the input serial data SDT. FIG. 11B shows the first extracted clock ECK11. FIG. 11C shows the second extracted clock ECK12. FIG. 11D shows the third extracted clock ECK13. FIG. 11E shows the fourth extracted clock ECK14. FIG. 11F shows the fifth extracted clock ECK15.

In what follows, the input data signal rate is assumed to be 1/f.

The data signal SDT is supplied to the clock input terminal C of the DFF 311. The DFF 311 latches the inverted signal of the fourth extracted clock ECK14 at the rising of the data signal SDT and outputs the latched signal as the first extracted clock ECK11.

From the extracted clock ECK11, the fifth extracted clock ECK15 is generated by the delay elements 312-1 through 312-4 of 1/f second.

The delay elements 312-1 through 312-4 are feedback-controlled by the phase comparator 314 so as to align the phases of the inverted signal of the fifth extracted clock ECK15 and the first extracted clock ECK11.

As a whole, the DFF 311 and the delay elements 312-1 through 312-3 take a form of a ½ divider of the input data signal SDT, with the input of the DFF 311 delayed by ¾ bit through the delay elements 312-1 through 312-3. Hence, after the inversion of the output of the DFF 311, data input is ignored for a time equivalent to ¾ bit.

As a result, as shown in FIGS. 11A through 11F, clocks ECK11 through ECK15 having a ½ frequency synchronized with the reference transition are extracted.

Then, latching the input data at both the rising and falling edges thereof in the DFFs 315-1 through 315-8 by use of the extracted clocks ECK11 through ECK14 allows the latching of the input data signal SDT and de-serializing the input data signal SDT by ⅛.

Figure 3:
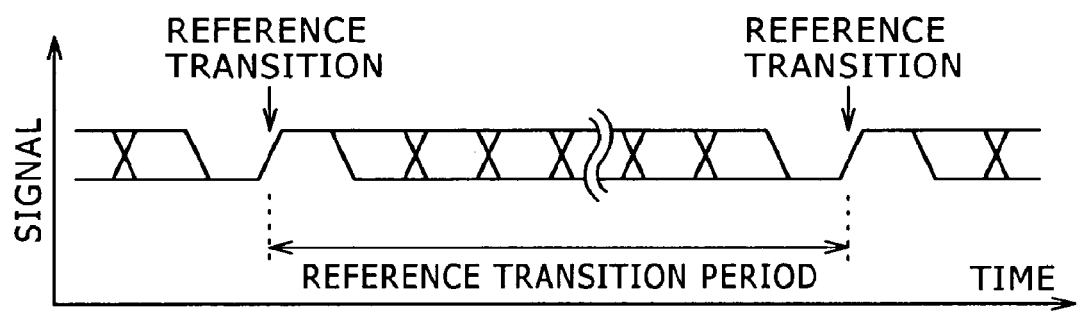
FIG. 3 is a transition diagram illustrating a scheme for maintaining a bit transition rate, this scheme being a clock-embedded transmission scheme based on reference transition.
Figure 4:
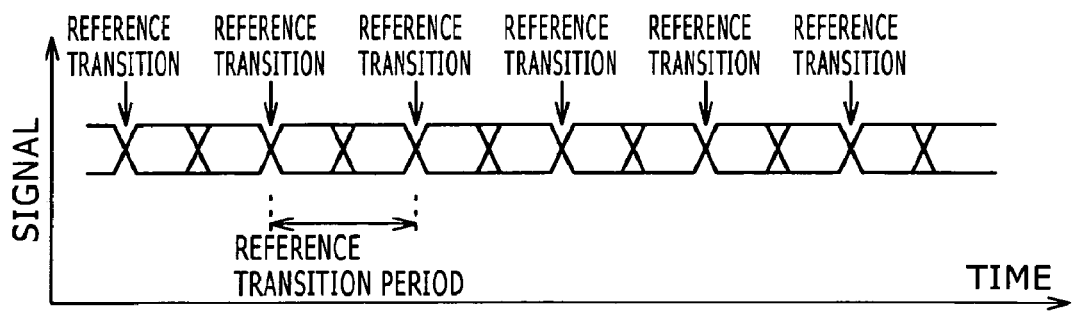
FIG. 4 is a transmission diagram illustrating one example of a transmission signal based on Manchester encoding.
Figure 5:
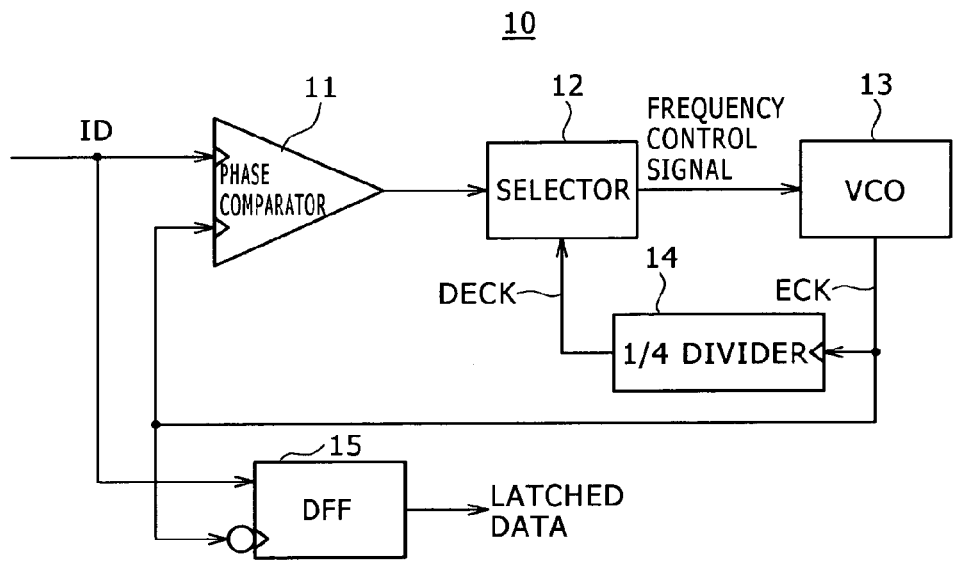
FIG. 5 is a block diagram illustrating an exemplary configuration of a CDR circuit for executing clock recovery of a data signal by use of the reference transition shown in FIG. 3.
Figure 6:
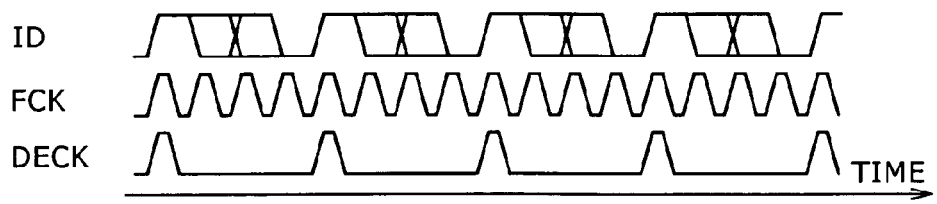
FIG. 6 is a timing chart indicative of an outline of an operation of the CDR circuit shown in FIG. 5.
Figure 7:
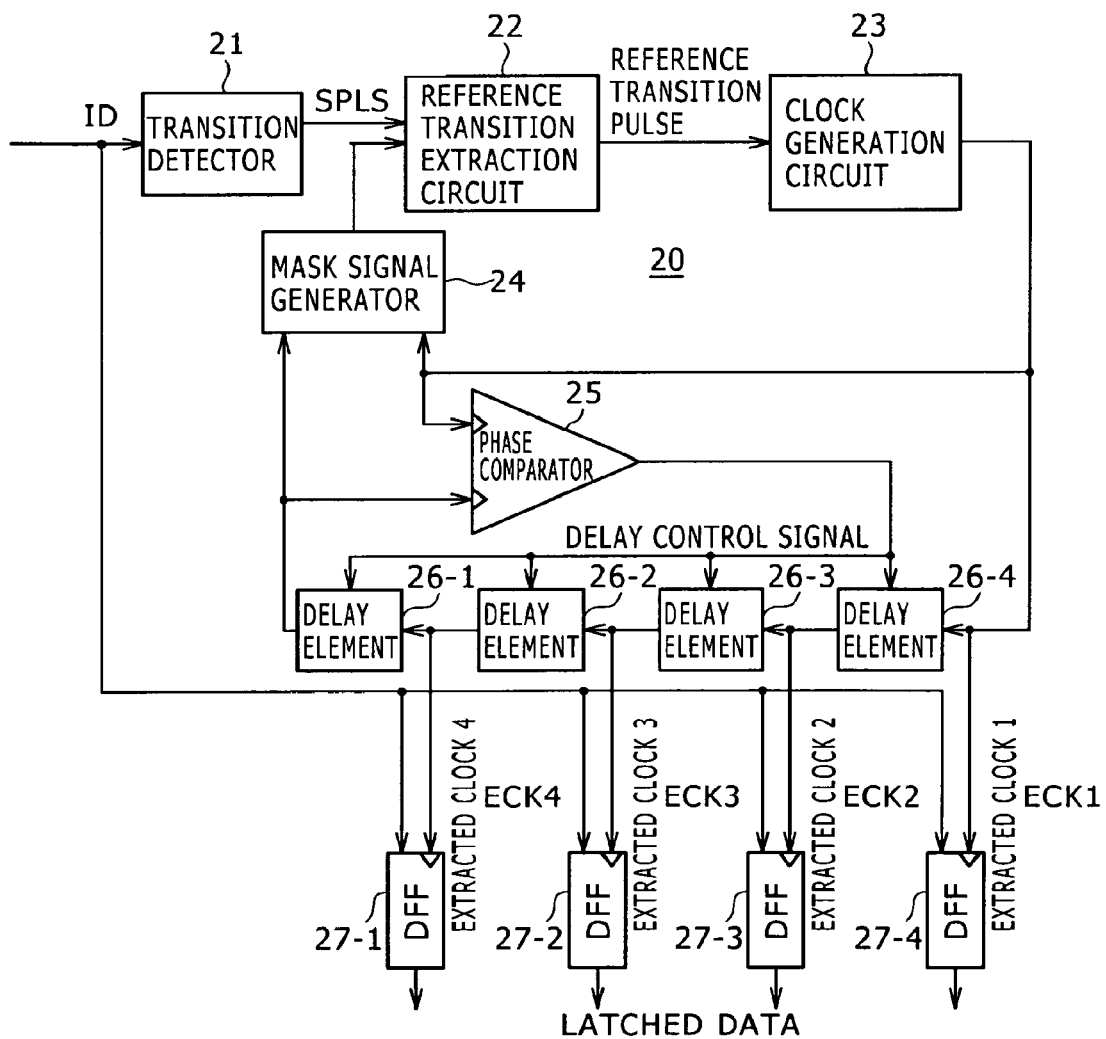
FIG. 7 is a block diagram illustrating an exemplary configuration of a CDR circuit for executing clock recovery of a data signal by use of a reference transition disclosed in Patent Document 1.
Figure 8:
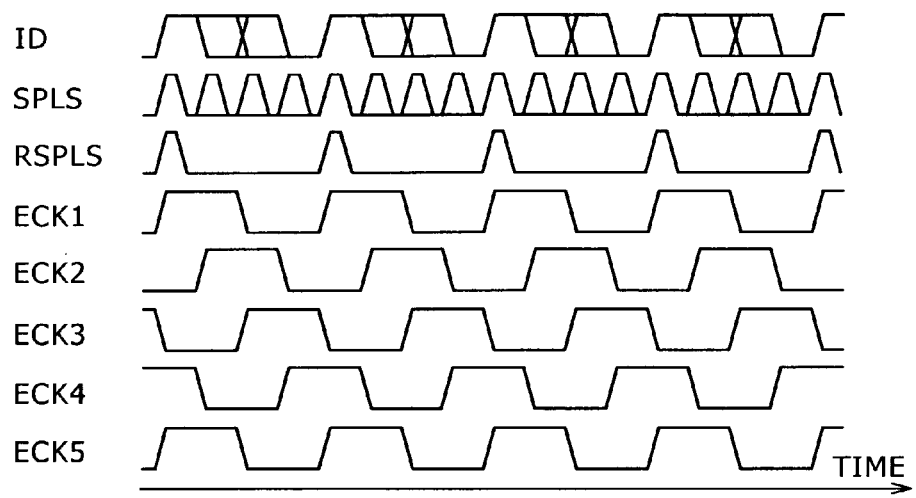
FIG. 8 is a timing chart indicative of an outline of an operation of the CDR circuit shown in FIG. 7.

If the CDR circuit 310 shown in FIG. 10 is used, a jitter resistance almost equal to that of the circuit shown in FIG. 7 can be provided because the maximum delay amount up to the following of the phase with a jitter applied to the input data signal is only 4/f second as with the CDR circuit shown in FIG. 7.

Further, a high-speed operation can be realized because the operation frequency inside the CDR circuit 310 is a signal having a maximum of ⅛f Hz and, unlike the circuit shown in FIG. 7, no delay is caused by the mask signal generation circuit, the reference transition extraction circuit, and the clock generation circuit.

In addition, although the CDR circuit shown in FIG. 7 requires the entry of an initialization signal composed of only the reference transition at the startup of the circuit, the CDR circuit according to the present embodiment is able to execute initialization by other signals.

(2) Second Embodiment

Figure 12:
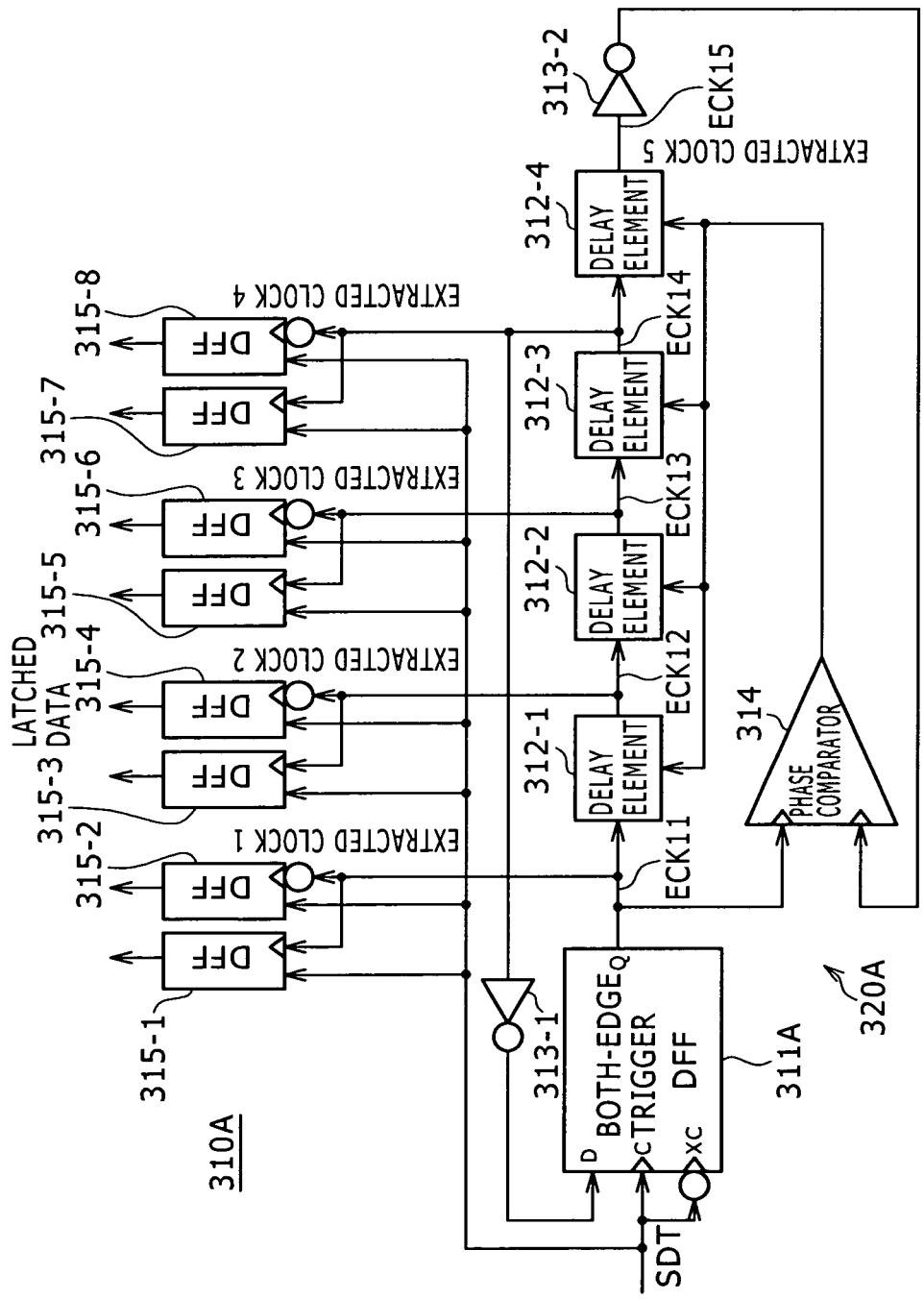
FIG. 12 is a block diagram illustrating an exemplary configuration of a CDR circuit in a reception apparatus practiced as a second embodiment of the present technology.

Referring to FIG. 12, there is shown an exemplary configuration of a CDR circuit in a reception apparatus practiced as the second embodiment of the present technology.

FIGS. 13A through 13F are timing charts indicative of an outline of an operation of the CDR circuit shown in FIG. 12.

Figure 13:
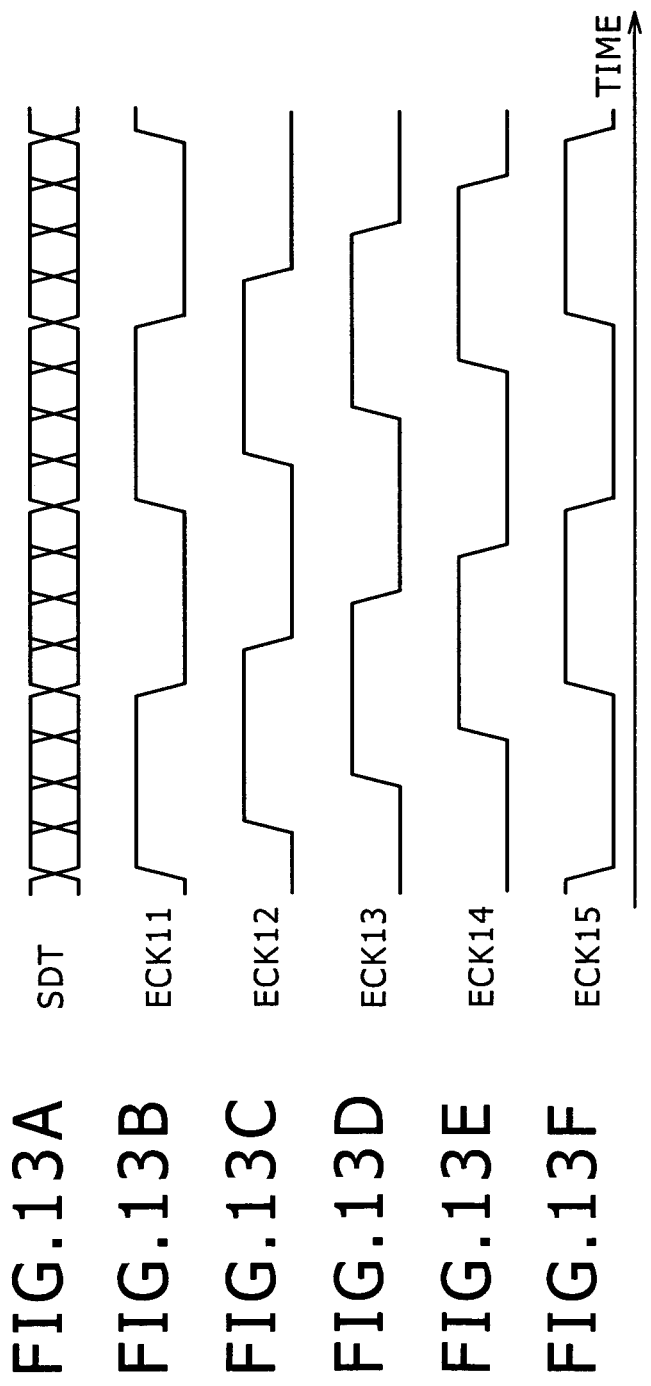
FIGS. 13A through 13F are timing charts indicative of an outline of an operation of the CDR circuit shown in FIG. 12.

FIG. 13A shows input serial data SDT. FIG. 13B shows the first extracted clock ECK11. FIG. 13C shows the second extracted clock ECK12. FIG. 13D shows the third extracted clock ECK13. FIG. 13E shows the fourth extracted clock ECK14. FIG. 13F shows the fifth extracted clock ECK15.

A CDR circuit 310A according to the second embodiment differs from the CDR circuit 310 according to the first embodiment in the following points.

The CDR circuit 310 according to the first embodiment extracts a clock synchronized with the rising edge of data signal SDT.

The CDR circuit 310A according to the second embodiment is configured as a circuit compatible with both the rising and falling for the reference transition.

To be more specific, the CDR circuit 310A shown in FIG. 12 is formed by a both-edge trigger DFF with a DFF 311A for division having two normal and inverted clock input terminals C and XC.

The other configurational portions are the same as those of the CDR circuit 310 shown in FIG. 10.

As described above, the CDR circuit 310A according to the second embodiment can extract a clock also from the data signal as shown in FIG. 13A by applying a DFF that operates on both the rising and falling edges to the DFF 311A that generates the first extracted clock ECK11.

(3) Third Embodiment

Figure 14:
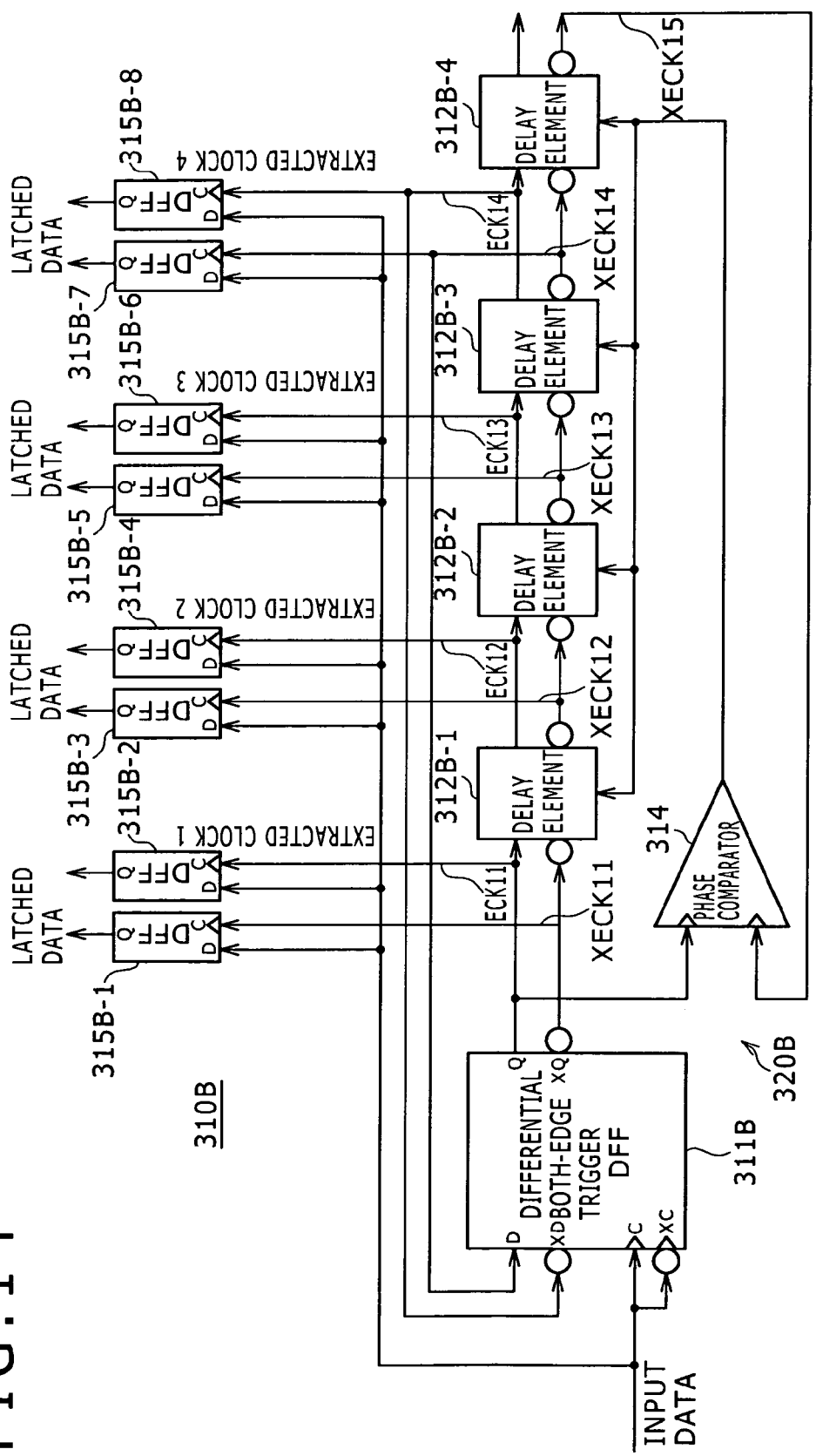
FIG. 14 is a block diagram illustrating an exemplary configuration of a CDR circuit in a reception apparatus practiced as a third embodiment of the present technology.

Referring to FIG. 14, there is shown an exemplary configuration of a CDR circuit in a reception apparatus practiced as a third embodiment of the present technology.

The CDR circuit 310B according to the third embodiment differs from the CDR circuit 310A according to the second embodiment in that the CDR circuit 310B has a differential configuration.

To be more specific, the DFF 311B is formed by a differential both-edge-trigger DFF and cascaded delay elements are formed by delay elements 312B-1 through 312B-4.

Latch DFF 315B-1 through DFF 315B-8 each have a normal clock terminal C for clock input and no clock input for the negative (inverted) side.

Further, the CDR circuit 310B according to the third embodiment requires no inverter that is required by the CDR circuit 310 and the CDR circuit 310A according to the first and second embodiments.

The clock input terminal C and the clock inverted input terminal XC of the DFF 311B are connected to the supply line of the serial data signal SDT that is a received input signal.

The data input terminal D of the DFF 311B is connected to the inverted data output terminal of the delay element 312B-3 and the inverted data input terminal XD is connected to the normal-side output of the delay element 312B-3.

The data output terminal Q of the DFF 311B is connected to the normal-side input of the delay element 312B-1, one input terminal of a phase comparator 314 and the clock input terminal C of the DFF 315B-2. The inverted output terminal XQ of the DFF 311B is connected to the inverted clock input terminal of the delay element 312B-2 and the clock input terminal C of the DFF 315B-1.

The DFF 311B outputs the first extracted clock ECK11 from the data output terminal Q and outputs a first extracted inverted clock XECK11 from the inverted output terminal XQ.

The normal-side output of the delay element 312B-1 is connected to the normal-side input terminal of the delay element 312B-2 and the clock input terminal C of the DFF 315B-4 and the inverted output is connected to the inverted data input terminal of the delay element 312B-2 and the clock input terminal C of the DFF 315B-3.

The delay element 312B-1 outputs the second extracted clock ECK12 obtained by delaying the first extracted clock ECK11 by the DFF 311B and second extracted inverted clock XECK12 obtained by delaying the first extracted inverted clock XECK11 by the DFF 311B.

The normal-side output of the delay element 312B-2 is connected to the normal-side input terminal of the delay element 312B-3 and the clock input terminal C of the DFF 315B-6 and the inverted output is connected to the inverted data input terminal of the delay element 312B-3 and the clock input terminal C of the DFF 315B-5.

The delay element 312B-2 outputs the third extracted clock ECK13 obtained by delaying the second extracted clock ECK12 by the delay element 312B-1 and the third extracted inverted clock XECK13 obtained by delaying the second extracted inverted clock XECK12 by the delay element 312B-1.

The normal-side output of the delay element 312B-3 is connected to the normal-side input terminal of the delay element 312B-4, the clock input terminal C of the DFF 315B-8 and the inverted data input terminal XD of the DFF 311B. The inverted output of the delay element 312B-3 is connected to the inverted data input terminal of the delay element 312B-4, the clock input terminal C of the DFF 315B-7, and the data input terminal D of the DFF 311B.

The delay element 312B-3 outputs the fourth extracted clock ECK14 obtained by delaying the third extracted clock ECK13 by the delay element 312B-2 and the fourth extracted inverted clock XECK14 obtained by delaying the third extracted inverted clock XECK13 by the delay element 312B-2.

The inverted output of the delay element 312B-4 is connected to the other input of the phase comparator 314.

The delay element 312B-4 outputs the fifth extracted inverted clock XECK15 obtained by delaying the fourth extracted inverted clock XECK14 by the delay element 312B-3.

The output of the phase comparator 314 is connected to the control terminal for adjusting the delay amount of the cascaded delay elements 312B-1 through 312B-4.

The phase comparator 314 feedback-controls the delay amount of the delay elements 312B-1 through 312B-4 as to align the phases of the inverted signal of the fifth extracted inverted clock XECK15 and the first extracted clock ECK11.

The data input terminal D of the data latch DFF 315B-1 through 315B-8 is connected to the supply line of the serial data signal SDT that is an input signal.

The following describes an operation of the CDR circuit 310B having the configuration described above.

FIGS. 15A through 15K are timing charts indicative of an outline of an operation of the CDR circuit shown in FIG. 14.

FIG. 15A shows the input serial data SDT. FIG. 15B shows the first extracted clock ECK11. FIG. 15C shows the first extracted inverted clock XECK11.

FIG. 15D shows the second extracted clock ECK12. FIG. 15E shows the second extracted inverted clock XECK12. FIG. 15F shows the third extracted clock ECK13. FIG. 15G shows the third extracted inverted clock XECK13.

FIG. 15H shows the fourth extracted clock ECK14. FIG. 15I shows the fourth extracted inverted clock XECK14. FIG. 15J shows the fifth extracted clock ECK15. FIG. 15K shows the fifth extracted inverted clock XECK15.

Here, the input data signal rate is assumed to be 1/f.

The data signal SDT is supplied to the clock input terminal C and the clock inverted input terminal XC of the DFF 311B.

The DFF 311B latches the fourth extracted inverted clock XECK14 and the fourth extracted clock ECK14 at the rising and falling of the data signal SDT to output the first extracted clock ECK11 and the first extracted inverted clock XECK11, respectively.

From the first extracted clock ECK11 and the first extracted inverted clock XECK11, the fifth extracted inverted clock XECK15 is generated by the 1/f second delay elements 312B-1 through 312B-4.

Here, the delay elements 312B-1 through 312B-4 are feedback-controlled by the phase comparator 314 so as to align the phases of the fifth extracted inverted clock XECK15 and the first extracted clock ECK11.

As a whole, the DFF 311B and the delay elements 312B-1 through 312B-3 take a form of the ½ divider of the input data signal SDT. The input of the DFF 311B is delayed by ¾ bit by the delay elements 312B-1 through 312B-3 behind the output of the DFF 311B. Hence, during a time equivalent to ¾ bit after the inversion of the output of the DFF 311B, data input is ignored.

As a result, as shown in FIGS. 15A through 15K, the clocks ECK11 through ECK15 and the inverted clocks XECK11 through XECK15 having ½ frequency synchronized with the reference transition are extracted.

Then, by use of the extracted clocks ECK11 through ECK14 and the extracted inverted clocks XECK11 through XECK14, the input data is latched in the DFF 315B-1 through 315B-8. Consequently, the input data signal SDT can be latched and, at the same time, ⅛ deserialization can be achieved.

According to the third embodiment of the present technology, the inverter element required by the CDR circuit 310A shown in FIG. 2 need not be arranged, thereby achieving an operation at higher speeds.

As described above and according to the embodiments of the present technology, there is provided a reception apparatus based on a signal transmission scheme in which a clock signal is inserted in a certain period, especially, a CDR circuit, thereby providing a resistance against an input jitter generally the same as that of the circuit shown in FIG. 7, resulting in high-speed clock extraction.

Namely, according to the embodiments of the present technology, high-speed clock extraction, high jitter input resistance, and signal error suppression can be achieved with a simple circuit configuration.

While preferred embodiments of the present technology have been described using specific terms, such description is for illustrative purpose only, and it is to be understood that changes and variations may be made without departing from the spirit or scope of the following claims.

The present disclosure contains subject matter related to that disclosed in Japanese Priority Patent Application JP 2010-177337 filed in the Japan Patent Office on Aug. 6, 2010, the entire content of which is hereby incorporated by reference.

What is claimed is:

1. A reception apparatus comprising:
    a Clock Data Recovery circuit, abbreviated as a CDR circuit, configured to receive a serial data signal propagated over a data line and regularly inserted with a signal transition to recover a clock and data in accordance with the received serial data signal, said CDR circuit including
    a divider having a delay element for extracting, as a trigger, a data input regularly inserted with a signal transition and
    a latch for latching an input data signal in synchronization with a clock extracted by said divider,
    wherein said divider has
    a flip-flop configured to enter data from a data input terminal of said flip-flop in synchronization with an input signal into a clock input terminal of said flip-flop and output the held data from a data output terminal of said flip-flop as an extraction clock, and
    one of one delay element connected to said data output terminal of said flip-flop and a plurality of delay elements cascaded to said data output terminal of said flip-flop;
    each of said delay elements outputs an extracted clock obtained by delaying an input clock; and
    an inverted signal of an output extracted clock of any one of said one delay element and said plurality of delay elements is supplied to said data input terminal of said flip-flop.

2. The reception apparatus according to claim 1, wherein said flip-flop is of a both-edge trigger type that synchronizes with rising and falling edges of an input data signal transition.

3. The reception apparatus according to claim 2, wherein said flip-flop is of a differential both-edge-trigger type having a data input terminal and an inverted data input terminal and a data output terminal and an inverted data output terminal, thereby outputting an extracted clock from said data output terminal and an extracted inverted clock from said inverted data output terminal; and
    said each delay element includes a normal-side input terminal in which an extracted clock is entered, an inverted input terminal in which an extracted inverted clock is entered and a normal-side output terminal from which an extracted clock is outputted and an inverted output terminal from which an extracted inverted clock is outputted,
    said data input terminal of said flip-flop being supplied with one of an output extracted inverted clock of said one delay element and an output extracted inverted clock of any one of said plurality of delay elements,
    said inverted data input terminal of said flip-flop being supplied with one of an output extracted clock of said one delay element and an output extracted clock of any one of said plurality of delay elements.

4. The reception apparatus according to claim 1, further comprising:
    a plurality of latches configured to latch an input data signal in synchronization with an output clock of said flip-flop and a clock outputted from one of said one delay element and said plurality of delay elements.

5. A clock data recovery circuit comprising:
    a clock input terminal of a divider flip-flop electrically connected to a supply line, said supply line being electrically connected to a data input terminal of a first latch flip-flop and to a data input terminal of a second latch flip-flop;
    a normal-side output terminal of the divider flip-flop electrically connected to a clock input terminal of the first latch flip-flop and to a normal-side input terminal of a first delay element, an input terminal of a phase comparator being electrically connected to said normal-side output terminal of the divider flip-flop.

6. The clock data recovery circuit according to claim 5, further comprising:

an output of the phase comparator electrically connected to a control terminal of the first delay element.

7. The clock data recovery circuit according to claim 5, further comprising:
a normal-side output terminal of the first delay element electrically connected to a normal-side input terminal of a second delay element.

8. The clock data recovery circuit according to claim 7, further comprising:
a clock input terminal of a third latch flip-flop electrically connected to said normal-side output terminal of the first delay.

9. The clock data recovery circuit according to claim 7, further comprising:
a normal-side output terminal of the second delay element electrically connected to a normal-side input terminal of a third delay element.

10. The clock data recovery circuit according to claim 9, further comprising:
a normal-side output terminal of the third delay element configured to output a third delay element clock, said divider flip-flop being configured to receive an inverted signal of the third delay element clock.

11. The clock data recovery circuit according to claim 10, further comprising:
a fourth delay element configured to output a fourth delay element clock, said normal-side output terminal of the third delay element being electrically connected to a normal-side input terminal of the fourth delay element.

12. The clock data recovery circuit according to claim 11, further comprising:
another input terminal of the phase comparator being configured to receive an inverted signal of the fourth delay element clock.

13. The clock data recovery circuit according to claim 5, further comprising:
an inverted clock input terminal of the second latch flip-flop electrically connected to said normal-side output terminal of the divider flip-flop.

14. The clock data recovery circuit according to claim 5, further comprising:
an inverted clock input terminal of the divider flip-flop electrically connected to said supply line.

15. The clock data recovery circuit according to claim 5, further comprising:
an inverted output terminal of the divider flip-flop electrically connected to a clock input terminal of the second latch flip-flop and to an inverted clock input terminal of the first delay element.

16. A reception apparatus comprising:
the clock data recovery circuit according to claim 5, said clock input terminal of the divider flip-flop being configured to receive a serial data signal.

17. A communication system comprising:
the reception apparatus according to claim 16;
a transmission apparatus configured to transmit said serial data signal to said supply line.

* * * * *